(12) United States Patent
Heiman et al.

(10) Patent No.: US 7,533,327 B2
(45) Date of Patent: May 12, 2009

(54) METHOD AND SYSTEM FOR BLUETOOTH DECODING

(75) Inventors: Arie Heiman, Rannana (IL); Arkady Molev-Shteiman, Bney Barak (IL); Yossy Pruzanski, Ramat Gan (IL); Benjamin Imanilov, Herzliya (IL)

(73) Assignee: Broadcom Corporation, Irvine, CA (US)

( * ) Notice: Subject to any disclaimer, the term of this patent is extended or adjusted under 35 U.S.C. 154(b) by 545 days.

(21) Appl. No.: 11/369,423

(22) Filed: Mar. 7, 2006

(65) Prior Publication Data

US 2007/0214402 A1    Sep. 13, 2007

(51) Int. Cl.
*H03M 13/00* (2006.01)
(52) U.S. Cl. .................................................. 714/781
(58) Field of Classification Search ............... 714/758, 714/776–777, 781, 795
See application file for complete search history.

(56) References Cited

U.S. PATENT DOCUMENTS 7,443,785 B2 * 10/2008 Bloebaum ................... 370/216

OTHER PUBLICATIONS

Lampe et al., Improved decoding for Bluetooth systems, 2005, IEEE, pp. 2511-2515.*

* cited by examiner

*Primary Examiner*—Shelly A Chase
(74) *Attorney, Agent, or Firm*—McAndrews, Held & Malloy, Ltd.

(57) ABSTRACT

A system and method for Bluetooth® decoding is disclosed and may include calculating a remainder value based on a received bit sequence and a generator polynomial for a corresponding transmitted Bluetooth bit sequence. Remainders may be generated from known error vectors and the generator polynomial. The generated remainders may result in at least a portion of the known error vectors corresponding to the generator polynomial. A codeword may be selected that may correspond to the calculated reminder value that matches one of the generated remainders. The generated remainders may be stored in a look-up table. An initial metric value may be calculated utilizing the following equation:

$$M_0 = \sum_{n=0}^{14} \mathrm{abs}(RX(n)),$$

where RX(n) may include the received bit sequence. The codeword with a metric value equal to M0 may be selected, if the calculated remainder value is equal to 0.

20 Claims, 8 Drawing Sheets

METHOD AND SYSTEM FOR BLUETOOTH DECODING

CROSS-REFERENCE TO RELATED APPLICATIONS/INCORPORATION BY REFERENCE

This application makes reference to:
U.S. application Ser. No. 11/189,509, filed on Jul. 26, 2005; and
U.S. application Ser. No. 11/189,634, filed on Jul. 26, 2005.

Each of the above stated applications is hereby incorporated herein by reference in its entirety.

FIELD OF THE INVENTION

Certain embodiments of the invention relate to wireless communication. More specifically, certain embodiments of the invention relate to a method and system for Bluetooth® decoding.

BACKGROUND OF THE INVENTION

Bluetooth® technology is revolutionizing personal connectivity by providing freedom from wired connections. Bluetooth® is a specification for a small form-factor, low-cost radio solution that provides links between mobile computers, mobile phones and other portable and handheld devices.

Bluetooth® wireless technology is an international, open standard that allows intelligent devices to communicate with each other through wireless, short-range communications. This technology allows Bluetooth® compliant devices such as computers, cell phones, keyboards, and headphones to establish connections, without wires, cables or any direct action from a user. Bluetooth® is currently incorporated into numerous commercial products including laptops, PDAs, cell phones, and printers, with more products coming out every day.

Bluetooth devices, such as mobile phones and PDAs, are evolving to become more complex as such devices may be adapted to transmit and receive audio information. For example, a Bluetooth® device may utilize a coder/decoder (CODEC) to encode audio information prior to communicating the encoded information to another Bluetooth® device, for example. Similarly, the CODEC may be utilized to decode encoded audio information received from another Bluetooth® device.

Furthermore, conventional Bluetooth®-enabled devices utilize computation-intensive algorithms for decoding Bluetooth® transmit data packages. In this regard, the implementation of the Bluetooth® decoders within the Bluetooth® enabled device may be costly and may result in inefficient and time-consuming Bluetooth® data decoding.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and method for Bluetooth® decoding, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for Bluetooth® decoding and may comprise calculating a remainder value based on a received bit sequence and a generator polynomial for a corresponding transmitted Bluetooth bitstream. The transmitted Bluetooth® bitstream may comprise a data package encoded by a Hamming code and/or a cyclic redundancy check (CRC). In one embodiment of the invention, the received Bluetooth® bitstream may be decoded by a Bluetooth® decoder using soft metrics of the received signal and the generator polynomial used for generating the transmitted Bluetooth® bitstream. In this regard, reliability of the decoded Bluetooth® data may be improved by using decoding techniques with limited computation complexity. In another embodiment of the invention, the Bluetooth® decoder may utilize an algorithm, such as an L_Best algorithm, for selecting a codeword for the received Bluetooth® bitstream from a list of L maximum likelihood decoded data packages, for example. Each of the decoded data packages may satisfy CRC information received with the Bluetooth® bitstream. In this regard, the L_Best algorithm may be applied when CRC is defined in the transmit Bluetooth® data package.

Figure 1:
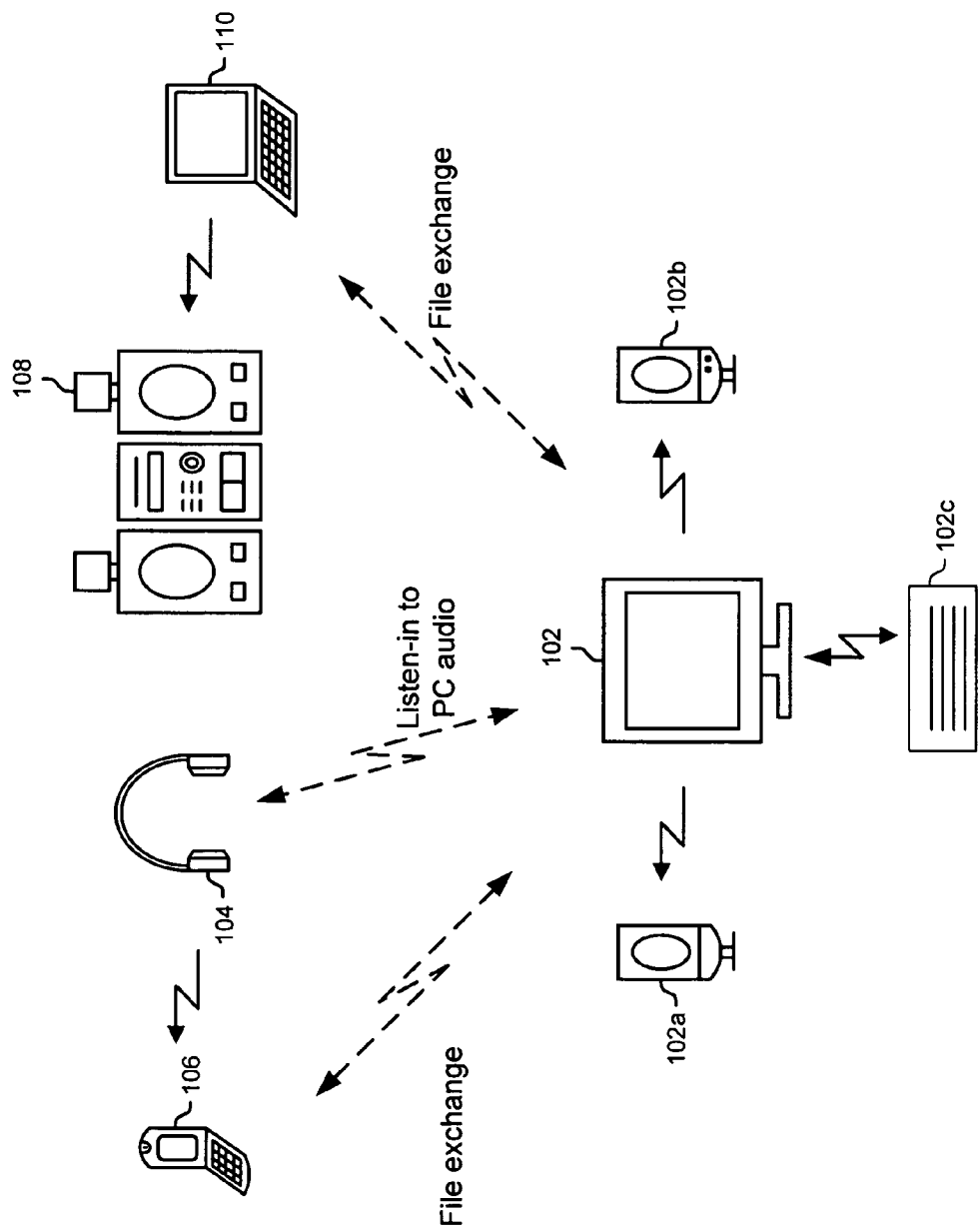
FIG. 1 is an exemplary diagram illustrating communication via various Bluetooth®-enabled devices, which may be utilized in connection with an embodiment of the invention.

FIG. 1 is an exemplary diagram illustrating communication via various Bluetooth®-enabled devices, which may be utilized in connection with an embodiment of the invention. Referring to FIG. 1, there is shown a stereo headset 104, a mobile phone 106, a Bluetooth®-enabled stereo system 108, personal computers (PC) 110 and 102, a keyboard 102c, and stereo speakers 102a and 102b. The stereo headset 104 may receive streaming audio from MP3 files stored on the mobile phone 106. The headset 104 may also function as a normal Bluetooth® telephony headset for phone calls. The Bluetooth®-enabled stereo system 108 may receive streaming audio from MP3 files stored on the PC 110, solving the problem of how to get the MP3's from the PC 110 to the stereo system 108. The PC 102 may play stereo audio to the pair of Bluetooth® wireless speakers 102a and 102b, thus freeing the desktop from wired clutter. The PC 102 may also communicate with the Bluetooth®-enabled keyboard 102c via a Bluetooth® connection.

The Bluetooth® protocol utilizes a frequency hopping spread spectrum (FHSS) radio system operating in the 2.4 GHz unlicensed band. Its low power transmissions allow a typical range of about 10 meters. Devices may connect to each other to form a network known as a piconet, with up to seven active devices in the piconet. The maximum data throughput between devices may be between 2.0 and 3.0 megabits per second (Mbps), with the data capacity shared between devices on the piconet.

The Bluetooth® protocol utilizes a protocol stack to transfer data and to implement various advanced features that may be required by various applications. The Bluetooth® protocol stack may comprise a plurality of different protocols designed for different purposes. Various profiles, or applications, may reside above the protocol stack, and utilize the services that are offered by the Bluetooth® protocol stack. The Bluetooth® protocol may also comprise a lower protocol stack for link management and baseband control.

One or more of the protocols within the Bluetooth® protocol stack, may reside within a host device, such as a Bluetooth® enabled device. Other protocols within the Bluetooth® protocol stack, such as protocols within the lower Bluetooth® protocol stack, may reside within the Bluetooth® chip. In this regard, Sub-Band Coding (SBC) encoding, or compression of audio data may be transferred from the upper Bluetooth® protocol stack to the lower Bluetooth® protocol stack residing on the Bluetooth® chip. Consequently, processing resources handled by a host processor within the Bluetooth® enabled device may be freed and allocated for other purposes.

Prior to transmitting Bluetooth® data, a Bluetooth®-enabled device may encode the data. For example, audio data may be encoded by a Bluetooth® transceiver within the mobile telephone 106 and/or the PCs 110 and 102 prior to transmission to the headphones 104, the stereo system 108 and/or the speakers 102a and 102b, respectively. The Bluetooth® data may be encoded utilizing a Hamming code (15, 10) and/or a cyclic redundancy check (CRC), for example. The Hamming code and the CRC may be used by the receiver to detect and correct one or more errors within the received bitstream. The Hamming code may encode 10 input bits and output a total of 15 encoded output bits. In one embodiment of the invention, decoding of the received encoded Bluetooth® bitstream as well as error detection may be improved by utilizing codeword metrics of the received signal.

Figure 2:
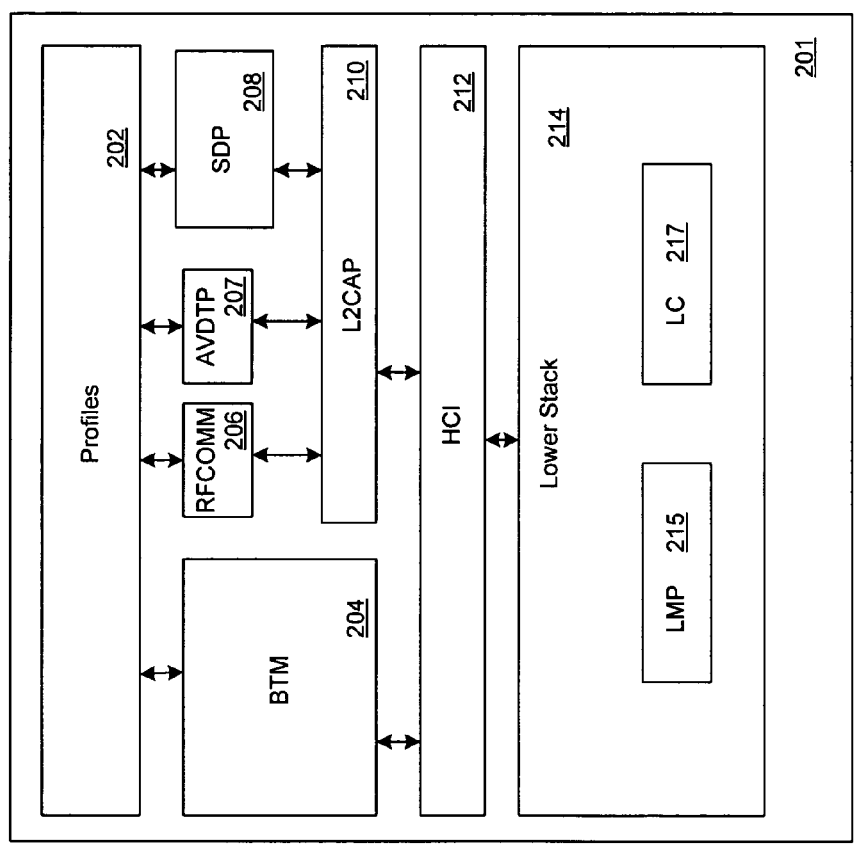
FIG. 2 is a diagram of an exemplary Bluetooth® protocol stack, which may be utilized in connection with an embodiment of the invention.

FIG. 2 is a diagram of an exemplary Bluetooth® protocol stack, which may be utilized in connection with an embodiment of the invention. Referring to FIG. 2, there is illustrated an exemplary Bluetooth® protocol stack 201. The exemplary Bluetooth® protocol stack 201 may comprise profiles layer 202, Bluetooth® management entity (BTM) layer 204, radio frequency communication (RFCOMM) protocol 206, audio/video distribution transport protocol (AVDTP) 207, service discovery protocol (SDP) 208, logical link control and adaptation protocol (L2CAP) 210, host controller interface (HCI) 212, and a lower stack 214. The profiles layer 202 may comprise profiles of one or more applications that may be utilized in connection with the Bluetooth® protocol stack. The BTM layer 204 makes it possible for various equipment to have wireless communication by integrating with a Bluetooth® module. The RFCOMM protocol 206 may be utilized to provide emulation of RS-232 serial ports over the L2CAP protocol, providing both transport capabilities for upper level services, such as OBEX, that use serial line as the transport mechanism.

The SDP 208 may be utilized for querying Bluetooth® device information, Bluetooth® device services, and characteristics of the services. The L2CAP 210 may be utilized to support higher level protocol multiplexing, packet segmentation and reassembly, and quality of service (QoS). L2CAP 210 may permit higher-level protocols and applications to transmit and receive data packets up to 64 kilobytes in length. The HCI 212 may be adapted to provide a command interface to the baseband controller, link manager, and access to hardware status and control registers.

In one embodiment of the invention, the L2CAP 210 may be utilized to discover another Bluetooth®-enabled device and configure a high-speed connection between the two Bluetooth® devices. For example, L2CAP 210 may be used to configure a high-speed data communication session between the two Bluetooth® devices, utilizing a high-speed data connection. The high-speed data connection between the two Bluetooth®-enabled devices may comprise an 802.11 connection or an ultra-wideband (UWB) connection.

The AudioNideo Distribution Transport Protocol (AVDTP) 207 is the protocol designed especially for Bluetooth® streaming audio and video. It may perform the signaling that may be utilized to configure, open, and/or close a stream between two Bluetooth® devices. An Audio stream data may be transferred utilizing real-time protocol (RTP) packets. AVDTP resides in the protocol stack above L2CAP and may utilize separate L2CAP channels for signaling and data.

The lower stack 214 may comprise a link manager protocol (LMP) 215 and a link controller (LC) 217. The link manager (LM) 215 may be adapted to carry out link setup, authentication, link configuration and other protocols. The link manager 215 may also discover other remote LM's and communicates with them via the LMP. To perform its service provider role, the LM 215 may utilize the underlying Link Controller (LC) 217. The LMP essentially comprises a number of protocol data units (PDUs), which may be sent from one device to another, determined by an address in the packet header, for example. The LMP 215 may control the communication between various Bluetooth® enabled devices, such as a phone and a PC.

The LC 217 within the lower stack 214 may be adapted to handle Bluetooth® baseband functions, such as encoding of voice and/or data packets, error correction, slot delimitation, frequency hopping, radio interface, data encryption, and/or link authentication. For example, the LC 217 may be adapted to utilize Hamming code to encode Bluetooth® data prior to transmission. The LC 217 may also utilize CRC within the encoded Bluetooth® data to facilitate error detection and correction by the Bluetooth® receiver. In addition, the LC 217 may be adapted to execute link management software associated with the LMP 215. The link manager's control may include setting up the communication link and performing authentication, configuration, and other protocols, for example. In an exemplary embodiment of the invention, the lower stack 214 may comprise an advanced audio distribution profile (A2DP) utilizing SBC encoding or compression. In this regard, the A2DP implemented within the lower stack 214 may be adapted to handle audio data formatting, such as compression or encoding.

Figure 3:
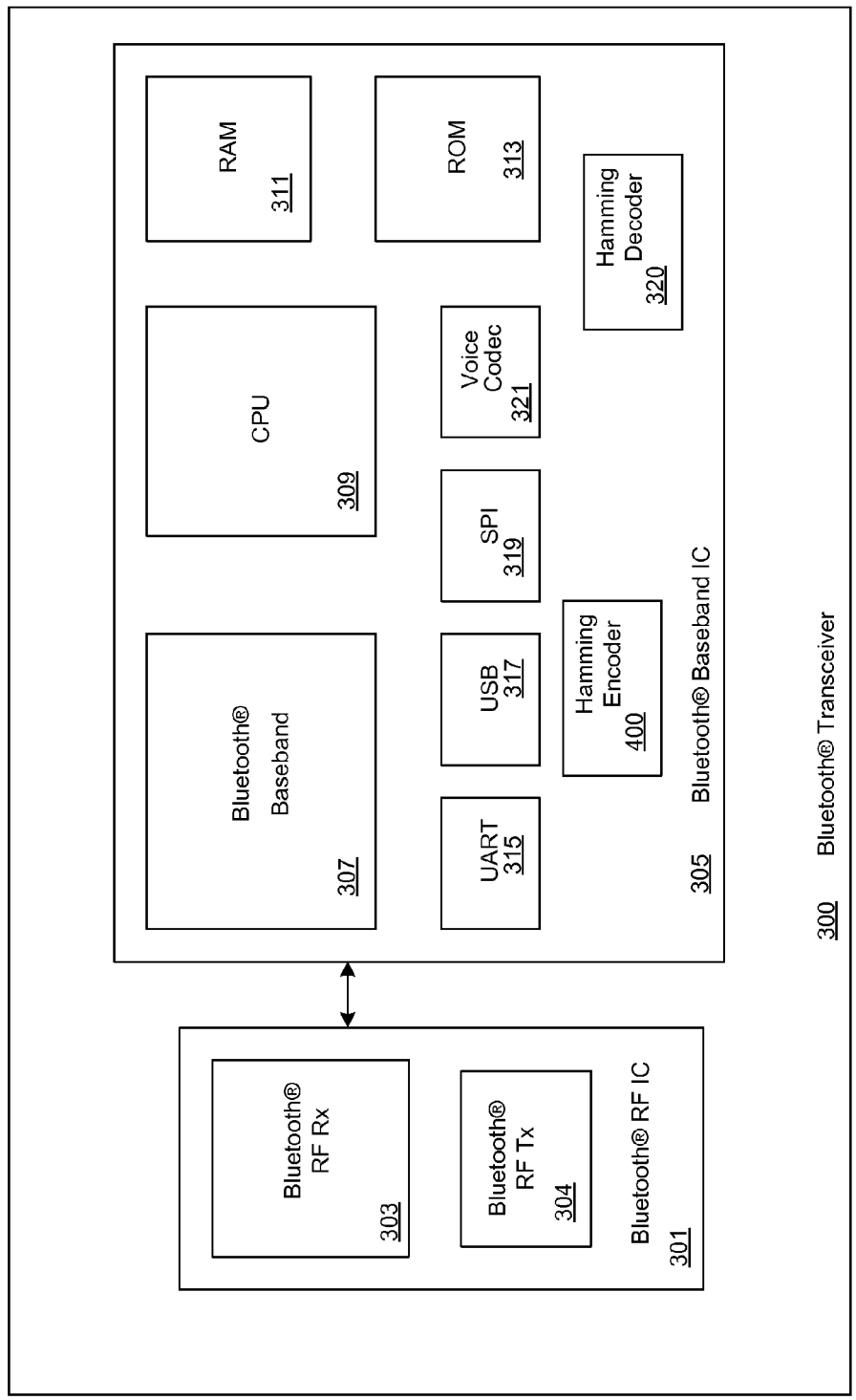
FIG. 3 is a block diagram illustrating an exemplary Bluetooth® hardware implementation, which may be utilized in connection with an embodiment of the invention.

FIG. 3 is a block diagram illustrating an exemplary Bluetooth® hardware implementation, which may be utilized in connection with an embodiment of the invention. Referring to FIG. 3, the Bluetooth® hardware implementation may comprise a Bluetooth® transceiver 300. The Bluetooth® transceiver 300 may comprise a Bluetooth® baseband integrated circuit (IC) 305 and a Bluetooth® radio frequency (RF) IC 301. The Bluetooth® RF IC 301 may comprise a Bluetooth® RF receiver (Rx) circuit 303 and a Bluetooth® RF transmitter (Tx) circuit 304. The Bluetooth® baseband IC 305 may comprise Bluetooth® baseband block 307, processor 309, random access memory (RAM) 311, read only memory (ROM) 313, voice CODEC 321, a serial peripheral interface (SPI) 319, universal serial bus (USB) 317, and universal asynchronous receiver/transmitter (UART) 315. The Bluetooth® RF IC 301 may be implemented in a separate chip. The processor 309 may be adapted to operate all the required software including lower stack, upper stack, and embedded profile, for example. This type of single CPU implementation allows for a small, low power, and low cost solution.

The Bluetooth® baseband block 307 may comprise suitable circuitry, logic, and/or code and may enable conversion of a received signal to a Bluetooth® baseband signal. The voice CODEC 321 may comprise suitable circuitry, logic, and/or code and may enable the decoding of received encoded voice signals. The UART 315 may comprise suitable circuitry, logic, and/or code and may enable serial transmission of information, which may be used in connection with modems and for non-networked communication between Bluetooth®-enabled devices. The RAM 311 and ROM 313 may be used for storing information during the conversion of the received signals to Bluetooth® baseband signals. The USB 317 and the SPI 319 may enable communication of information to and from the baseband IC 305.

The 723 kbps throughput of a Bluetooth® link may be suitable for streaming audio utilizing MP3 and/or other codec formats. Bluetooth® streaming audio may be defined by three Bluetooth® specifications covering the protocol and profiles comprising AVDTP, GAVDP, and A2DP. The AudioNideo Distribution Transport Protocol (AVDTP) is the protocol designed especially for Bluetooth® streaming audio and video. It may perform the signaling that may be utilized to configure, open, and/or close a stream between two Bluetooth® devices. Audio stream data may be transferred utilizing real-time protocol (RTP) packets. AVDTP resides in the protocol stack above L2CAP and may utilize separate L2CAP channels for signaling and data.

The Generic AudioNideo Distribution Profile (GAVDP) is an abstract profile that defines how applications can use AVDTP. The Advanced Audio Distribution Profile (A2DP) defines how BluetoothO streaming audio applications may operate. For example, A2DP defines how to get and set audio CODEC parameters for MPEG and/or other codecs. The A2DP may also define the media payload formats for packaging audio stream data into packets and may contain the specification for the low-complexity sub-band CODEC (SBC). In this regard, the SBC may be implemented on-chip within the Bluetooth® baseband IC 305 and may be used for audio data compression of uncompressed data received from the Bluetooth® RF IC 301. For example, the SBC may be implemented within the processor 309 or may be implemented outside the processor 309, as a separate compression acceleration block.

In one embodiment of the invention, the CPU 309 may be enabled to decode Bluetooth® bitstream data received by the Bluetooth® RF IC 301. In this regard, the Bluetooth® baseband IC 305 may comprise a Hamming encoder block 400 and a Hamming decoder block 320. Received Bluetooth® bitstream data may comprise 15-bit Bluetooth® data packets encoded by a Bluetooth®-enabled device using Hamming code (10, 15), for example. The Hamming decoder 320 may comprise suitable circuitry, logic, and/or code and may be used to decode a received 15-bit Bluetooth® encoded packet and generate a corresponding 10-bit decoded packet. Hamming code and/or CRC may be used to detect and/or correct one or more errors within the received encoded packet. Furthermore, Bluetooth® codeword metric information may be used to decrease computational complexity during the decoding and increase the reliability of the decoded data.

Figure 4A:
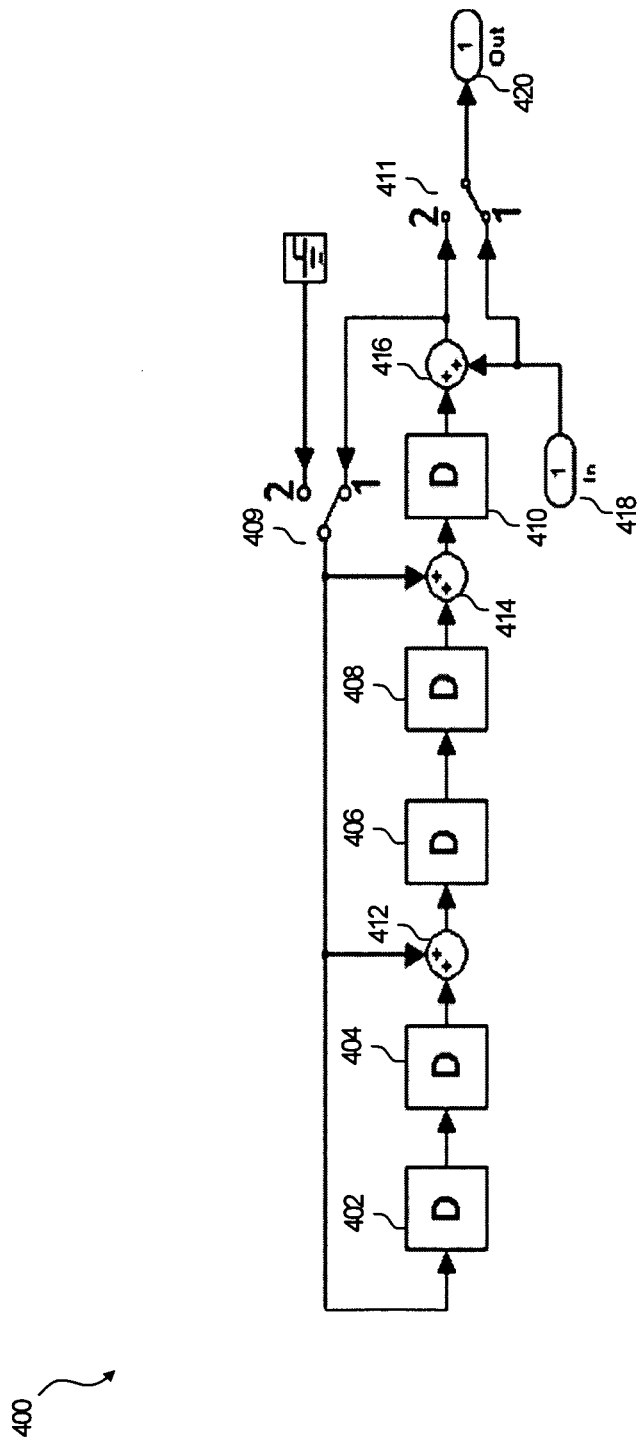
FIG. 4A is a block diagram of a Hamming encoder, which may be utilized in accordance with an embodiment of the invention.

FIG. 4A is a block diagram of a Hamming encoder, which may be utilized in accordance with an embodiment of the invention. Referring to FIG. 4A, the Hamming encoder 400 may comprise delay blocks 402, . . . , 410, adders 412, . . . , 416, and switches 409 and 411. The Hamming encoder 400 may comprise a (15, 10) Hamming encoder and may use 10 bits at the input 418 to generate 15 bits at the output 420.

In operation, 10 information bits, for example, may be communicated at the input 418, while both switches 409 and 411 remain in position 1. After the 10 input bits are received at the input 418, the switches 409 and 411 may switch to position 2 and 5 parity bits may be output sequentially from the delay blocks 402, . . . , 410 so that a total of 15 bits may be communicated at the output 420. Since the minimum "Hamming distance" between any two 15-bit Hamming codewords is 3 bits, a Hamming decoder may be used to correct a plurality of single errors and detect a plurality of double errors in each codeword.

The Hamming encoder 400 may use the following generator polynomial for generating the 15-bit codeword at the output 420:

$$G(D)=(D+1)\cdot(D^4+D+1)$$

Furthermore, the 15-bit output codeword may be systematic. In this regard, the first 10 bits of the output codeword may be the same as the 10 input bits and the balance of 5 bits may comprise parity check bits. In addition, the remainder resulting from dividing the output sequence TX(D) by the generator polynomial G(D) is zero, which may be expressed by the equation:

$$\mathrm{mod}(TX(D),G(D))=0$$

Therefore, $TX(D)=\mathrm{In}(D)\cdot D^5+R(D)=0$, where R(D) may comprise a remainder. The remainder R(D) may be expressed by the equation:

$$R(D)=\mathrm{mod}(\mathrm{In}(D)\cdot D^5, G(D))$$

Figure 4B:
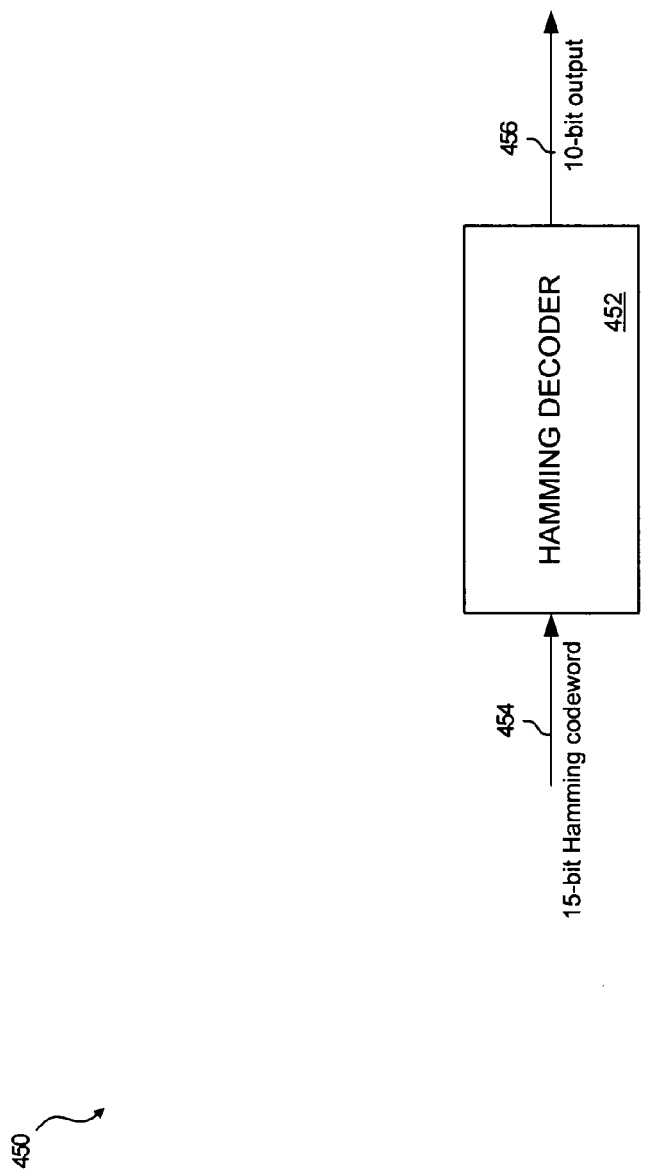
FIG. 4B is a block diagram of a Hamming decoder, which may be utilized in accordance with an embodiment of the invention.

FIG. 4B is a block diagram 450 of a Hamming decoder, which may be utilized in accordance with an embodiment of the invention. The Hamming decoder 452 may comprise suitable circuitry, logic, and/or code and may be used to decode a 15-bit Hamming codeword 454 to generate a 10-bit output 456. In this regard, the Hamming decoder 452 may comprise a (15, 10) Hamming decoder. The Hamming decoder 452 may be adapted to output a 10-bit sequence 456 selected from a Hamming codeword dictionary, for example, that has a minimal number of different bits, or Hamming Distance with the received 15-bit sequence 454. The Hamming codeword dictionary may be maintained in RAM, such as RAM 311 in FIG. 3. Since the 15-bit Hamming codeword 454 comprises 10 information bits, a Hamming codeword dictionary may comprise $2^{10}$, or 1024 possible codewords. The Hamming code may be characterized with the property that the minimal number of different bits, or the Hamming Distance between any pair of codewords, is three. Consequently, the Hamming decoder 452 may be adapted to correct one error and/or to detect two errors, respectively. In one embodiment of the invention, the Hamming decoder 452 may utilize soft metrics of the received 15-bit Hamming codeword 454 and the generator polynomial used for generating the transmitted Bluetooth® bitstream. In this regard, reliability of the decoded Bluetooth® 10-bit output packet 456 may be improved by using decoding techniques with limited computation complexity.

An error vector may be defined as a 15-bit sequence:

$$E(n) = \begin{cases} 1 & \text{Bit \# } n \text{ is incorrect} \\ 0 & \text{Bit \# } n \text{ is correct} \end{cases}$$

Therefore, sign(RX(n))=TX(n)+E(n) for (0≦n<15), where TX(n) comprises the transmitted sequence and RX(n) comprises the received sequence. The Hamming code may be selected so that the reminder from division of the received sequence by the generator polynomial may be equal to the reminder from the division of the error vector by the generator polynomial:

R(D)=mod(sign(RX(D)), G(D))=mod(TX(D), G(D))+mod(E(D), G(D))=mod(E(D), G(D))

In this regard, the Hamming decoder 452 may be adapted to correct a single error. If $E_K(n)$ is denoted as an error vector that comprises a single error in bit number k, then:

$$E_K(n) = \begin{cases} 1 & n = k \\ 0 & \text{else.} \end{cases}$$

If the relative remainder is denoted as $R_K(n)$, then $R_K(D)$=mod($E_K(D)$, G(D)). Since the generator polynomial is primitive, each error vector comprises a corresponding and unique remainder. In this regard, $R_K(D)=R_M(D)$, for k=m. Since the Hamming codeword 454 comprises 15 bits, there are 15 possible errors vector with 15 corresponding remainders.

Even though a 15-bit Hamming codeword is utilized herein, the present invention may not be so limited. An N-bit Hamming word may also be utilized with k-number of information bits, where k<N.

Figure 5:
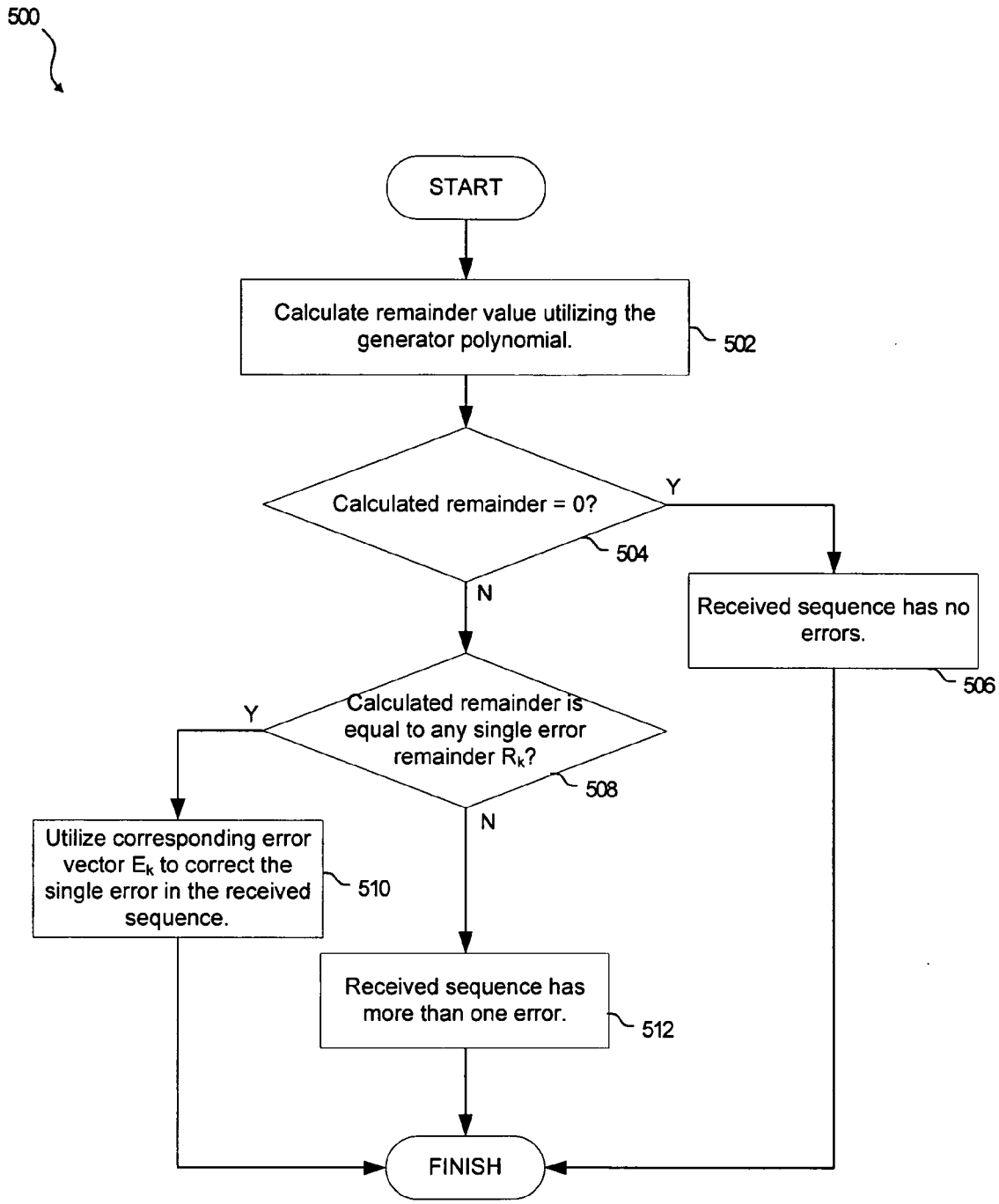
FIG. 5 is a flow diagram illustrating exemplary steps for detecting errors within a received Bluetooth® data package, in accordance with an embodiment of the invention.

FIG. 5 is a flow diagram illustrating exemplary steps for detecting errors within a received Bluetooth® data package, in accordance with an embodiment of the invention. At 502, a remainder value may be calculated using the generator polynomial R(D) above. At 504, it may be determined whether the calculated remainder is equal to 0. If the calculated remainder is equal to 0, at 506, it may be determined that the received sequence has no errors. If the calculated remainder is not equal to 0, at 508, it may be determined whether the calculated remainder is equal to any single error remainder $R_k$. If the calculated remainder is equal to any single error remainder $R_k$, at 510, a corresponding error vector $E_k$ may be used to correct the single error in the received sequence. If the calculated remainder is not equal to any single error remainder $R_k$, at 512, it may be determined that the received sequence comprises more than one error.

Referring again to FIG. 4B, a soft metric $M_K$ for each the 1024 possible codewords within the Hamming codeword dictionary may be defined by the equation:

$$M_K = \sum_{n=0}^{14} RX(n) \cdot C_K(n),$$

where k comprises a codeword number (0≦k<1024), RX(n) comprises a received signal with 0≦n<15, $C_K$ comprises codeword number k, and $M_K$ comprises soft metric number k. A Maximum likelihood codeword may comprise the codeword with a maximum correlation, or soft metric. In one embodiment of the invention, the Hamming decoder 452 may search the Hamming codeword dictionary for codewords with the maximum metric to recover the most likely transmitted bits.

In another embodiment of the invention, the Hamming decoder 452 may be implemented by utilizing a Viterbi algorithm. In this regard, the Hamming decoder 452 may utilize 11 bit transitions. The first 10 transitions may be equal to the first 10 input bits, and the final transition may comprise 5 bits that may be equal to the final 5 state bits. The received encoded sequence may be represented by the equation:

$$RX(n) = \begin{cases} In(n) & 0 \le n < 10 \\ State\ (n-10) & 10 \le n < 15 \end{cases}$$

Therefore, the Hamming decoder 452 may use convolution code with 5 bits state register and may be implemented by using a $2^5$ or 32-state Viterbi convolution decoder algorithm. In this regard, each bit from the first independent 10 bits, may increase the number of states by a factor of two. Consequently, 2^10 states may be created, before the trellis may start to close to state zero. In another embodiment of the invention, the complexity of the Viterbi Hamming decoder may be further reduced by using combinatory analysis of error vectors. For each error vector E(n), the reminder from division of the received sequence by the generator polynomial may be equal to the reminder from division of the error vector by the generator polynomial:

R(D)=mod(sign(RX(D)),G(D))=mod(E(D),G(D)),
where sign(RX(n))=TX(n)+E(n).

It may be assumed that each error vector may comprise 2 or 3 errors, for example. A combinatory analysis of a 15-bit error vector may generate the following results:

There may be 1 error vector without any errors—

$$\binom{15}{0} = 1.$$

There may be 15 error vectors with one error—

$$\binom{15}{0} = 15.$$

There may be 105 error vectors with two errors—

$$\binom{15}{2} = 105.$$

There may be 445 error vectors with three errors—

$$\binom{15}{3} = 445.$$

Since a remainder may comprise 5 bits, there may be $2^5$ or 32 possible remainders. Therefore, for each remainder there may be a subgroup of error vectors that may correspond to the remainder. The error vector subgroups may be calculated by the following algorithm.

A remainder $R=\mathrm{mod}(E_m,G)$ may be calculated for each error vector $E_m$ ($0 \leq m < (1+15+115+455)$). Each error vector $E_m$ may then be added to a subgroup of error vectors that may be used to generate the remainder R. The calculated remainders and corresponding error vectors may be stored in a look-up table, for example. If a remainder is zero, then it may be concluded that the received Bluetooth® 15-bit codeword has no error. After the remainders and the corresponding error vectors are calculated, there may be a total of 15 remainders that have a subgroup of 29 related error vectors (1 error vector with one error and 28 error vectors with three errors). Similarly, there may be 15 remainders that have subgroup of 7 related error vectors (each error vector has 2 errors), and there may be one remainder that has a subgroup of 35 related error vectors (each error vector has 3 errors). In this regard, the above results may be stored in a look-up table of 32 subgroups. The look-up table may be maintained in RAM, such as RAM 311 in FIG. 3.

In one embodiment of the invention, for any received encoded sequence, a remainder may be calculated using the generator polynomial. The generated remainder may be used to obtain error vectors from a look-up table subgroup, which may correspond to the generated remainder. For each error vector from the subgroup, a Bluetooth® codeword may be obtained from a Hamming codeword dictionary, for example. For each codeword, a codeword metric may be calculated and a codeword with maximum metric may be selected as the decoded codeword.

Figure 6:
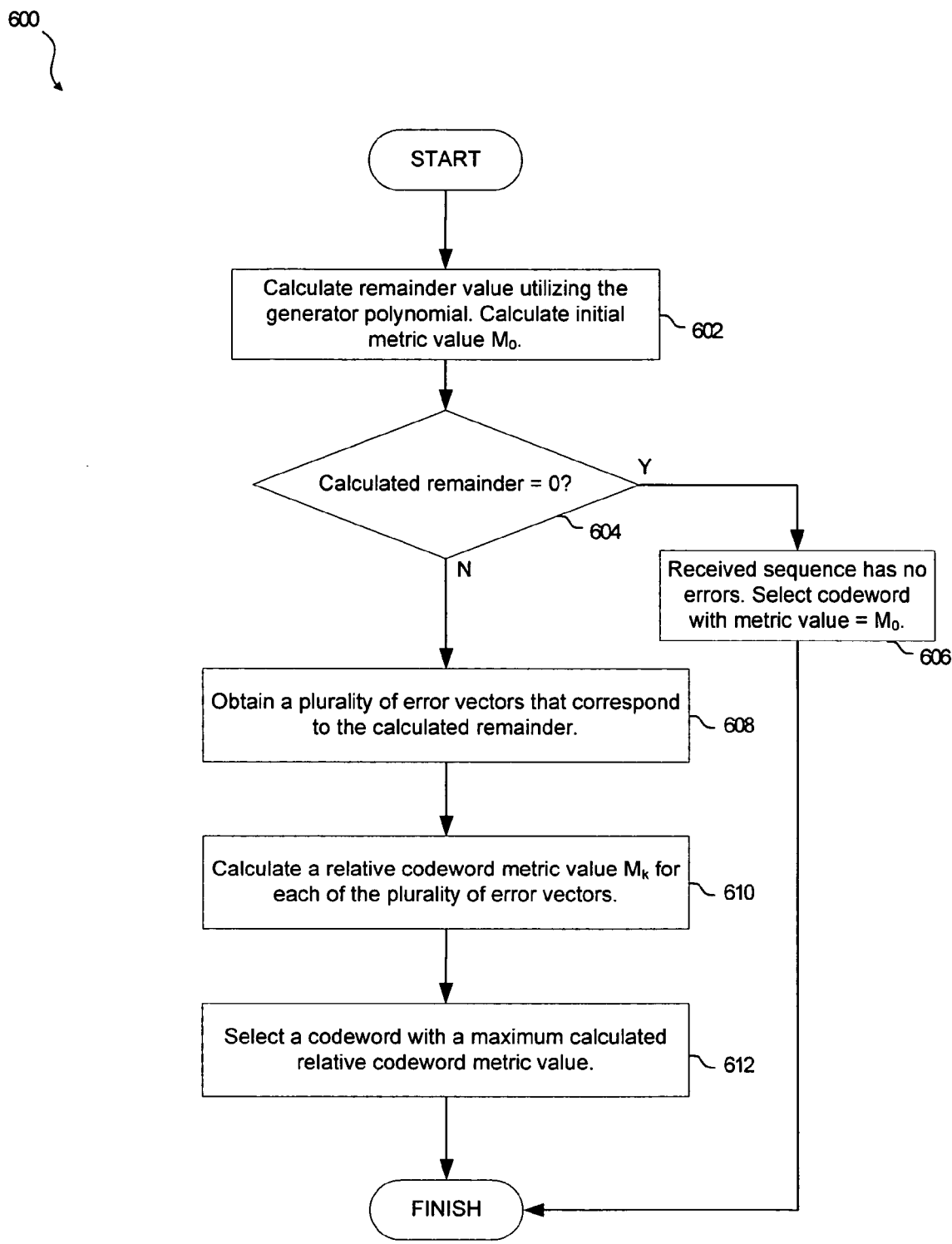
FIG. 6 is a flow diagram illustrating exemplary steps for detecting errors within a received Bluetooth® data package utilizing codeword metric values, in accordance with an embodiment of the invention.

FIG. 6 is a flow diagram illustrating exemplary steps for detecting errors within a received Bluetooth® data package utilizing codeword metric values, in accordance with an embodiment of the invention. Referring to FIG. 6, at 602, a remainder R may be calculated by dividing a received sequence by a generator polynomial. An initial metric $M_0$ may be calculated using the equation:

$$M_0 = \sum_{n=0}^{14} \mathrm{abs}(RX(n)),$$

where RX((n) comprises the received signal. At 604, it may be determined whether the calculated remainder R is equal to 0. If the calculated remainder R is equal to 0, at 606, it may be determined that the received sequence has no errors and a codeword with metric value of $M_0$ may be selected. If the calculated remainder R is not equal to 0, at 608, a plurality of error vectors that correspond to the calculated remainder R may be obtained from a look-up table, for example. At 610, a relative codeword metric value $M_k$ may be calculated for each of the plurality of error vectors. The relative codeword metric value $M_k$ may be calculated utilizing the equation:

$$M_K = M_0 - 2 \cdot \sum_{q=0}^{LN_K} \mathrm{abs}(RX(P_K(q))),$$

where $LN_K$ comprises a number of errors in error vector $E_K$, and $P_K(q)$ comprises a position of error number q in error vector $E_K$. At 612, a codeword with a maximum codeword metric value may be selected as the Hamming decoder output.

In one embodiment of the invention, the Hamming decoder 320 in FIG. 3 may be implemented by using an algorithm for selecting a list of L codewords with maximum codeword metric values (also referred to as L_Best algorithm), rather than selecting a single codeword with a maximum codeword metric value, as described in step 612 above. In this regard, the algorithm may be used when a CRC is defined in the encoded transmit data package.

If a CRC is used in the transmit data package, the degree and value of the CRC check word may be decided by a CRC generator polynomial. A CRC Bluetooth generator polynomial may be defined as $G(D)=D^{16}+D^{12}+D^5+1$. Since the degree of this polynomial is 16, the CRC is also 16 bits. A Bluetooth® packet with CRC has property that the remainder resulting from dividing the output sequence Packet(D) by the generator polynomial G(D) is zero, or mod(Packet(D), G(D))=0. In this regard, the decoded data packet may satisfy the CRC condition that the remainder of dividing the packet by the generator polynomial is zero.

The Bluetooth® working zone when CRC is defined may be the zone where the PER (Package Error Rate) is small enough. The PER may be calculated by the equation $PER=1-(1-BER)^N$. In instances where the Hamming code is defined in a Bluetooth® packet, the BER may comprise the Hamming blocks error rate and N may be the number of Hamming blocks in a Bluetooth® packet. In instances where the Hamming code is not defined in a Bluetooth® packet, the BER may comprise a bit error rate and N may comprise a number of bits in the Bluetooth® packet.

Using Newton's binomial, it may be determined that if BER is small enough, $PER=1-(1-BER)^N \approx 1-N \cdot BER$. The probability of a single error in a Bluetooth® packet may be determined by the equation:

$$P_{ONE\ ERROR} = N \cdot BER \cdot (1-BER)^{N-1}.$$

The probability that a Bluetooth® packet contains more then one error may be determined by the equation:

$$P_{MORE\ THEN\ ONE\ ERROR} = PER - P_{ONE\ ERROR} = PER \cdot \left(1 - \frac{P_{ONE\ ERROR}}{PER}\right).$$

If BER is small enough or less than a certain value or threshold, then the following may be true:

$$\left(1 - \frac{P_{ONE\ ERROR}}{PER}\right) = \left(1 - \frac{N \cdot BER \cdot (1-BER)^{N-1}}{1-(1-BER)^N}\right) \approx 1 - N \cdot BER \approx PER$$

Therefore, $P_{MORE\ THEN\ ONE\ ERROR}$=PER·PER. In this regard, the probability that the Bluetooth® packet contains more that one error is approximately equal to $PER^2$ and the defined working zone is negligible. Hence, single errors may be more common in received Bluetooth® packets.

For an exemplary Bluetooth® packet comprising N uncoded bits, it may be assumed that the packet comprises a single bit error. Accordingly, a CRC constraint may be satisfied by changing a single bit. For example, Q bits with weakest soft decisions may be obtained and the sign of these bits may be changed to an opposite sign. The generated output may then satisfy the CRC constraint. In one embodiment of the invention, Q may equal 30 bits, for example.

For an exemplary Bluetooth® packet comprising N Hamming blocks, it may be assumed that the packet comprises a single Hamming block error. Each Hamming block number n may comprise a metric $M_n^0$. A Q number of blocks with weakest metrics may be obtained. For each block number q, an L maximum likelihood solution may be obtained with metrics $M_q^0 M_q^1, \ldots, M_q^{L-1}$. The generated output may comprise a first solution that satisfies the CRC constraint. In one embodiment of the invention, Q may equal 30 and L may equal 4, for example.

Figure 7:
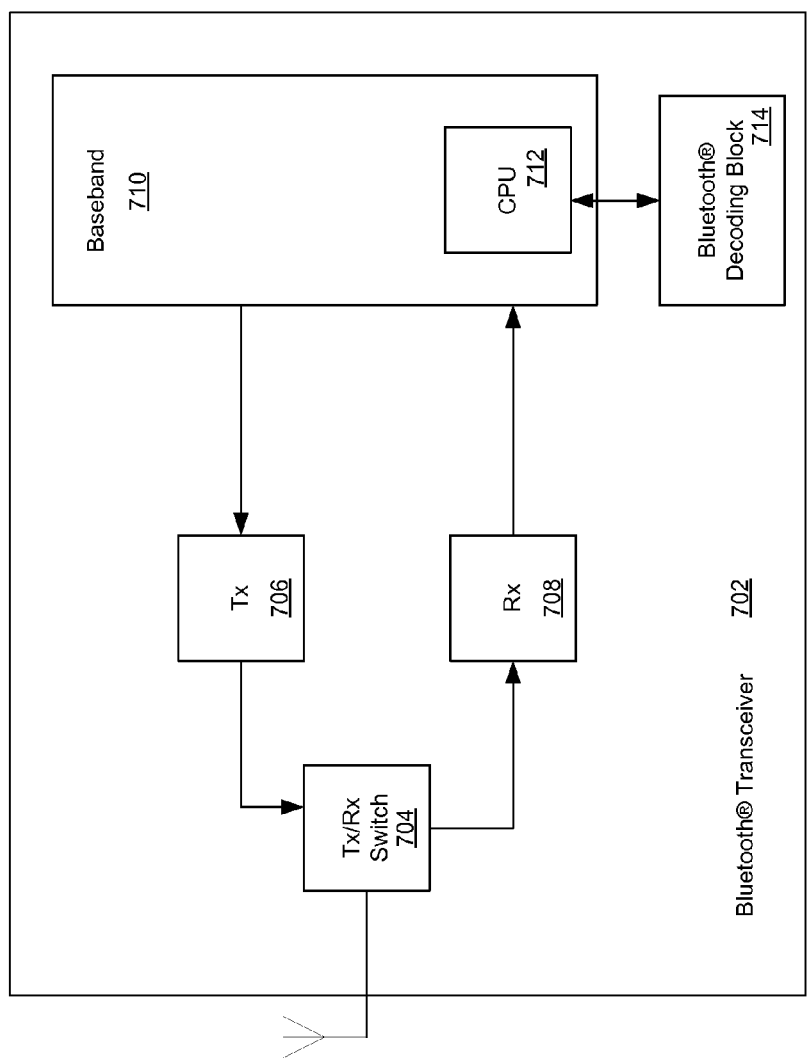
FIG. 7 is a block diagram of exemplary Bluetooth® transceiver utilizing Bluetooth® decoding, in accordance with an embodiment of the invention.

FIG. 7 is a block diagram of exemplary Bluetooth® transceiver utilizing Bluetooth® decoding, in accordance with an embodiment of the invention. Referring to FIG. 7, the Bluetooth® transceiver 702 may comprise a transmit/receive switch 704, a transmitter (Tx) block 706, a receiver (Rx) block 708, a baseband processing block 710 and a Bluetooth® decoding block 714. The Tx block 706 may comprise suitable circuitry, logic, and/or code and may enable transmission of signals received from the baseband block 710. The baseband block 710 may comprise suitable circuitry, logic, and/or code and may be adapted to convert baseband signals to RF signals, for example, for transmission by the Tx block 706. The Rx block 708 may comprise suitable circuitry, logic, and/or code and may enable receiving of RF signals from the Tx/Rx switch 704 and communicating the received RF signals to the baseband block 710. The baseband block 710 may also be adapted to convert received RF signals to baseband signals. The baseband processing block 710 may comprise a CPU 712. The functionalities of the baseband processing block 710 and the CPU 712 may be the same as the functionalities of the baseband IC 305 and the processor 309, as described above with regard to FIG. 3.

In one embodiment of the invention, the Bluetooth® decoding block 714 may enable calculation of a remainder value based on a received bit sequence and a generator polynomial for a corresponding transmitted Bluetooth bit sequence. The Bluetooth® decoding block 714 may enables generation of remainders that would result in error vectors corresponding to the generator polynomial. The Bluetooth® decoding block 714 may enable selection of a codeword that corresponds to the calculated reminder value that matches one of the generated remainders. The Bluetooth® decoding block 714 may enable storing of the generated remainders in a look-up table. The look-up table may be maintained in a RAM, such as the RAM 311 in FIG. 3. The Bluetooth® decoding block 714 may enable calculation of an initial metric value utilizing the following equation:

$$M_0 = \sum_{n=0}^{14} \text{abs}(RX(n)),$$

wherein RX(n) comprises the received bit sequence. The Bluetooth® decoding block 714 may enable selection of the codeword with a metric value equal to $M_0$, if the calculated remainder value is equal to 0. The Bluetooth® decoding block 714 may enable selection of at least a portion of the error vectors corresponding to the calculated remainder.

The Bluetooth® decoding block 714 may enable calculation of a relative codeword metric value $M_k$ for each of the selected at least the portion of the error vectors, utilizing the following equation:

$$M_K = M_0 - 2 \cdot \sum_{q=0}^{LN_K} \text{abs}(RX(P_K(q))),$$

where $$M_0 = \sum_{n=0}^{14} \text{abs}(RX(n)).$$

RX(n) may comprise the received bit sequence. $LN_K$ may comprise a number of errors in error vector $E_K$. $P_K(q)$ may comprise a position of error number q in error vector $E_K$. The Bluetooth® decoding block 714 may enable selection of the codeword based on a maximum one of the calculated relative codeword metric values. The Bluetooth® decoding block 714 may enable selection of the codeword based on a portion of the calculated relative codeword metric values. Each of the portion of the calculated relative codeword metric values may be greater than a threshold value. The generator polynomial may comprise a Hamming code generator polynomial and/or a cyclic-redundancy-check (CRC) generator polynomial.

Another embodiment of the invention may provide a machine-readable storage having stored thereon, a computer program having at least one code section for processing data, the at least one code section being executable by a machine for causing the machine to perform steps as disclosed herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The invention may also be embodied in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for processing data in a wireless communication system, the method comprising:
   calculating a remainder value based on a received bit sequence and a generator polynomial for a corresponding transmitted Bluetooth® bit sequence;
   generating remainders from known error vectors and said generator polynomial, wherein said generated remainders would result in at least a portion of said known error vectors corresponding to said generator polynomial; and
   selecting a codeword that corresponds to said calculated reminder value that matches one of said generated remainders.

2. The method according to claim 1, comprising storing said generated remainders in a look-up table.

3. The method according to claim 1, comprising calculating an initial metric value utilizing the following equation:

$$M_0 = \sum_{n=0}^{(N-1)} \text{abs}(RX(n)),$$

wherein RX(n) comprises said received bit sequence.

4. The method according to claim 3, comprising, if said calculated remainder value is equal to 0, selecting said codeword with a metric value equal to $M_0$.

5. The method according to claim 1, comprising selecting at least a portion of said known error vectors corresponding to said calculated remainder.

6. The method according to claim 5, comprising calculating a relative codeword metric value $M_k$ for each of said selected at least said portion of said known error vectors, utilizing the following equation:

$$M_K = M_0 - 2 \cdot \sum_{q=0}^{LN_K} \text{abs}(RX(P_K(q))),$$

-continued
wherein $$M_0 = \sum_{n=0}^{14} \text{abs}(RX(n)),$$

wherein RX(n) comprises said received bit sequence, wherein $LN_K$ comprises a number of errors in error vector $E_K$, and wherein $P_K(q)$ comprises a position of error number q in error vector $E_K$.

7. The method according to claim 6, comprising selecting said codeword based on a maximum one of said calculated relative codeword metric values.

8. The method according to claim 6, comprising selecting said codeword based on a portion of said calculated relative codeword metric values.

9. The method according to claim 8, wherein each of said portion of said calculated relative codeword metric values is greater than a threshold value.

10. The method according to claim 1, wherein said generator polynomial comprises one or both of a Hamming code generator polynomial and/or a cyclic-redundancy-check (CRC) generator polynomial.

11. A wireless communication system for processing data, the system comprising:
    at least one processor that enables calculation of a remainder value based on a received bit sequence and a generator polynomial for a corresponding transmitted Bluetooth® bit sequence;
    said at least one processor enables generation of remainders from known error vectors and said generator polynomial, wherein said generated remainders would result in at least a portion of said known error vectors corresponding to said generator polynomial; and
    said at least one processor enables selection of a codeword that corresponds to said calculated reminder value that matches one of said generated remainders.

12. The system according to claim 11, wherein said at least one processor enables storing of said generated remainders in a look-up table.

13. The system according to claim 11, wherein said at least one processor enables calculation of an initial metric value utilizing the following equation:

$$M_0 = \sum_{n=0}^{14} \text{abs}(RX(n)),$$

wherein RX(n) comprises said received bit sequence.

14. The system according to claim 13, wherein said at least one processor enables selection of said codeword with a metric value equal to $M_0$, if said calculated remainder value is equal to 0.

15. The system according to claim 11, wherein said at least one processor enables selection of at least a portion of said known error vectors corresponding to said calculated remainder.

16. The system according to claim 15, wherein said at least one processor enables calculation of a relative codeword metric value $M_k$ for each of said selected at least said portion of said known error vectors, utilizing the following equation:

$$M_K = M_0 - 2 \cdot \sum_{q=0}^{LN_K} \mathrm{abs}(RX(P_K(q))),$$

wherein $$M_0 = \sum_{n=0}^{14} \mathrm{abs}(RX(n)),$$

wherein RX(n) comprises said received bit sequence, wherein $LN_K$ comprises a number of errors in error vector $E_K$, and wherein $P_K(q)$ comprises a position of error number q in error vector $E_K$.

17. The system according to claim 16, wherein said at least one processor enables selection of said codeword based on a maximum one of said calculated relative codeword metric values.

18. The system according to claim 16, wherein said at least one processor enables selection of said codeword based on a portion of said calculated relative codeword metric values.

19. The system according to claim 18, wherein each of said portion of said calculated relative codeword metric values is greater than a threshold value.

20. The system according to claim 11, wherein said generator polynomial comprises one or both of a Hamming code generator polynomial and/or a cyclic-redundancy-check (CRC) generator polynomial.

* * * * *